(12) United States Patent
Lin et al.

(10) Patent No.: US 8,748,989 B2
(45) Date of Patent: Jun. 10, 2014

(54) FIN FIELD EFFECT TRANSISTORS

(75) Inventors: Yu Chao Lin, Rende Township (TW);
 Chih-Tang Peng, Taipei (TW);
 Shun-Hui Yang, Jungli (TW); Ryan Chia-Jen Chen, Chiayi (TW);
 Chao-Cheng Chen, Shin-Chu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/407,507

(22) Filed: Feb. 28, 2012

(65) Prior Publication Data

US 2013/0221443 A1 Aug. 29, 2013

(51) Int. Cl.
 *H01L 21/70* (2006.01)
(52) U.S. Cl.
 USPC .......................................... 257/368; 257/353
(58) Field of Classification Search
 USPC .......... 257/353, E21.411, E21.158, 369, 382, 257/E27.06, E27.062, 327, 506, 328, 397, 257/401, E29.267, 300, 255, E27.112, 365, 257/386
 See application file for complete search history.

(56) References Cited

U.S. PATENT DOCUMENTS

| 8,101,994 | B2 | 1/2012 | Yu et al. | |
| 2004/0262676 | A1* | 12/2004 | Lee et al. | 257/328 |
| 2008/0230852 | A1* | 9/2008 | Yu et al. | 257/401 |
| 2009/0261423 | A1* | 10/2009 | Sawada | 257/392 |
| 2009/0294857 | A1* | 12/2009 | Lee | 257/365 |
| 2011/0193175 | A1* | 8/2011 | Huang et al. | 257/386 |

FOREIGN PATENT DOCUMENTS

JP 2011-009296 1/2011

OTHER PUBLICATIONS

Office Action dated Sep. 27, 2013 and English translation from corresponding application No. KR 10-2012-0109918.

* cited by examiner

*Primary Examiner* — Bilkis Jahan
(74) *Attorney, Agent, or Firm* — Lowe Hauptman & Ham, LLP

(57) ABSTRACT

The disclosure relates to a fin field effect transistor (FinFET). An exemplary structure for a FinFET comprises a substrate comprising a major surface; a plurality of first trenches having a first width and extending downward from the substrate major surface to a first height, wherein a first space between adjacent first trenches defines a first fin; and a plurality of second trenches having a second width less than first width and extending downward from the substrate major surface to a second height greater than the first height, wherein a second space between adjacent second trenches defines a second fin.

20 Claims, 10 Drawing Sheets

FIN FIELD EFFECT TRANSISTORS

TECHNICAL FIELD

The disclosure relates to integrated circuit fabrication, and more particularly to a fin field effect transistor (FinFET).

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (FinFET). A typical FinFET is fabricated with a thin vertical "fin" (or fin structure) extending from a substrate formed by, for example, etching away a portion of a silicon layer of the substrate. The channel of the FinFET is formed in this vertical fin. A gate is provided over (e.g., wrapping) the fin. Having a gate on both sides of the channel allows gate control of the channel from both sides. In addition, strained materials in source/drain (S/D) portions of the FinFET utilizing selectively grown silicon germanium (SiGe) may be used to enhance carrier mobility.

However, there are challenges to implementation of such features and processes in complementary metal-oxide-semiconductor (CMOS) fabrication. For example, high stress of shallow trench isolation (STI) oxide causes fin deformation of the FinFET, thereby degrading the device performance.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DESCRIPTION

Figure 1:
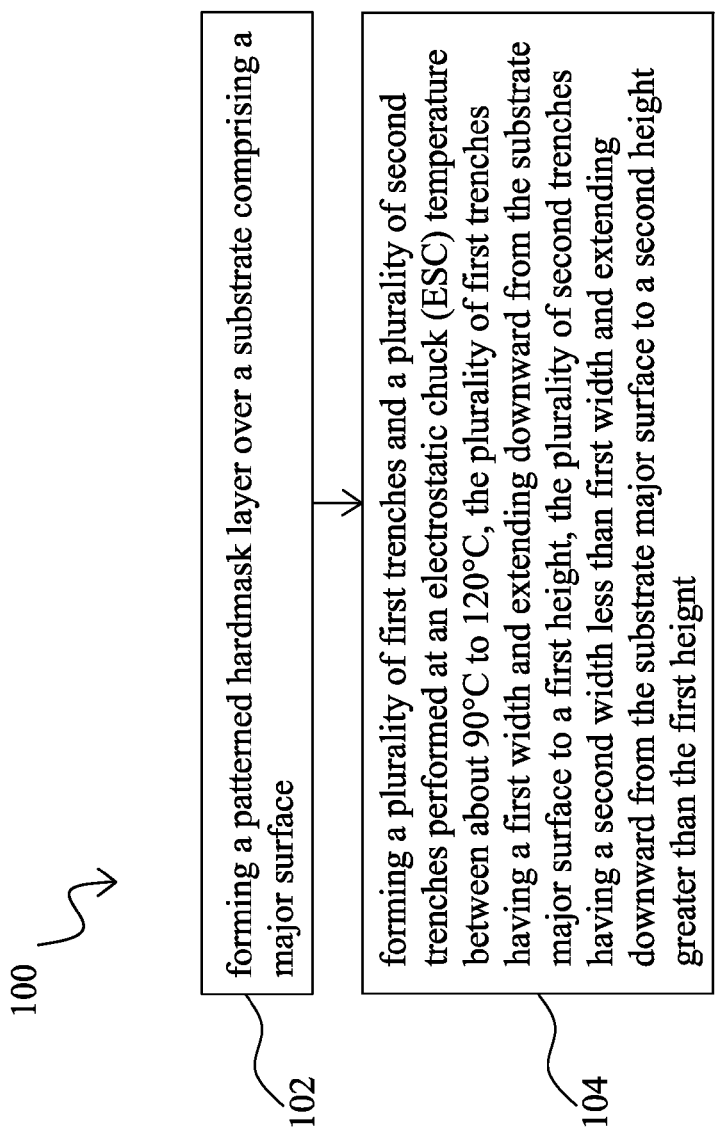
FIG. 1 is a flowchart of a method of fabricating a FinFET according to various aspects of the present disclosure.

It is understood that the following disclosure provides many different embodiments, or examples, for implementing different features of the invention. Specific examples of components and arrangements are described below to simplify the present disclosure. These are, of course, examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/ or configurations discussed.

Referring to FIG. 1, illustrated is a flowchart of a method 100 of fabricating a fin field effect transistor (FinFET) according to various aspects of the present disclosure. The method 100 begins with step 102 in which a patterned hardmask layer is formed over a substrate comprising a major surface. The method 100 continues with step 104 in which a plurality of first trenches and a plurality of second trenches are formed. The formation of the plurality of first trenches and the plurality of second trenches is performed at an electrostatic chuck (ESC) temperature (i.e., the ESC is set to have a temperature) between about 90° C. to 120° C., the plurality of first trenches having a first width and extending downward from the substrate major surface to a first height, the plurality of second trenches having a second width less than first width and extending downward from the substrate major surface to a second height greater than the first height. The discussion that follows illustrates embodiments of FinFETs that can be fabricated according to the method 100 of FIG. 1.

FIGS. 2A-2G are cross-sectional views of a fin field effect transistor (FinFET) 200 at various stages of fabrication according to various embodiment of the present disclosure. As employed in the present disclosure, the FinFET 200 refers to any fin-based, multi-gate transistor. The FinFET 200 may be included in a microprocessor, memory cell, and/or other integrated circuit (IC). It is noted that the method of FIG. 1 does not produce a completed FinFET 200. A completed FinFET 200 may be fabricated using complementary metal-oxide-semiconductor (CMOS) technology processing. Accordingly, it is understood that additional processes may be provided before, during, and after the method 100 of FIG. 1, and that some other processes may only be briefly described herein. Also, FIGS. 2A through 2G are simplified for a better understanding of the concepts of the present disclosure. For example, although only the FinFET 200 is depicted in FIGS. 2A-2G, it is understood the IC may comprise a number of other devices comprising resistors, capacitors, inductors, fuses, etc.

Figure 2A:
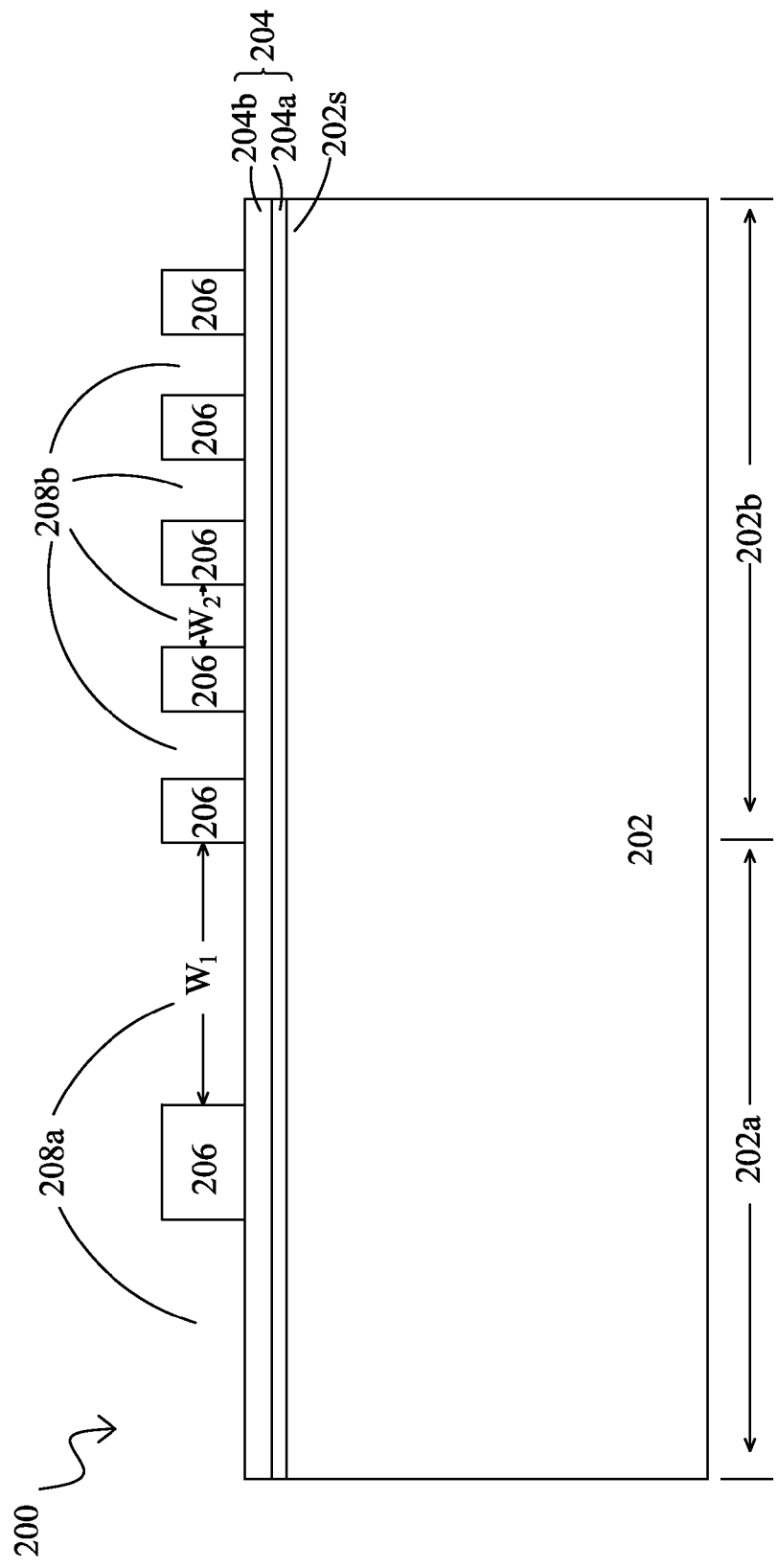
FIGS. 2A-2G are cross-sectional views of a FinFET at various stages of fabrication according to various embodiment of the present disclosure.

Referring to FIG. 2A, a substrate 202 comprising a major surface 202s is provided, wherein the substrate 202 comprises an sparse region (also being referred to as an "iso region") 202a and a dense region 202b. The dense region refers to a region where core devices would be formed, because the fin structures are densely formed. The sparse or iso region refers to a peripheral region where I/O devices would be formed, because the fin structures are not densely formed compared to the dense region.

In the depicted embodiment, the iso region 202a may be configured for an input/output (I/O) device, while the dense region 202b may be configured for a core device. In at least one embodiment, the substrate 202 comprises a crystalline silicon substrate (e.g., wafer). The substrate 202 may comprise various doped regions depending on design requirements (e.g., p-type substrate or n-type substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be usable for forming an n-type FinFET, or alternatively for forming a p-type FinFET.

In some alternative embodiments, the substrate 202 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. Further, the substrate 202 may include an epitaxial layer (epi-layer), may be strained for performance enhancement, and/or may include a silicon-on-insulator (SOI) structure.

The fins are formed by etching into the substrate 202. In at least one embodiment, a pad layer 204a and a mask layer 204b are formed on the semiconductor substrate 202. In the depicted embodiment, the pad layer 204a and mask layer 204b are collectively referred as a hardmask layer 204. The pad layer 204a may be a thin film comprising silicon oxide formed, for example, using a thermal oxidation process. The pad layer 204a may act as an adhesion layer between the semiconductor substrate 202 and mask layer 204b. The pad layer 204a may also act as an etch stop layer for etching the mask layer 204b. In some embodiments, the mask layer 204b is formed of silicon nitride, for example, using low-pressure chemical vapor deposition (LPCVD) or plasma enhanced chemical vapor deposition (PECVD). The mask layer 204b is used as a hardmask during subsequent photolithography processes. A photo-sensitive layer 206 is formed on the mask layer 204b and is then patterned, forming a plurality of first openings 208a and a plurality of second opening 208b in the photo-sensitive layer 206. In the depicted embodiment, the plurality of the first openings 208a has a first width $W_1$, while the plurality of the second opening 208b has a second width $W_2$ less than the first width $W_1$. In other words, the plurality of the first openings 208a is over the iso region 200a, while the plurality of second opening 208b is over the dense region 200b.

Figure 2B:
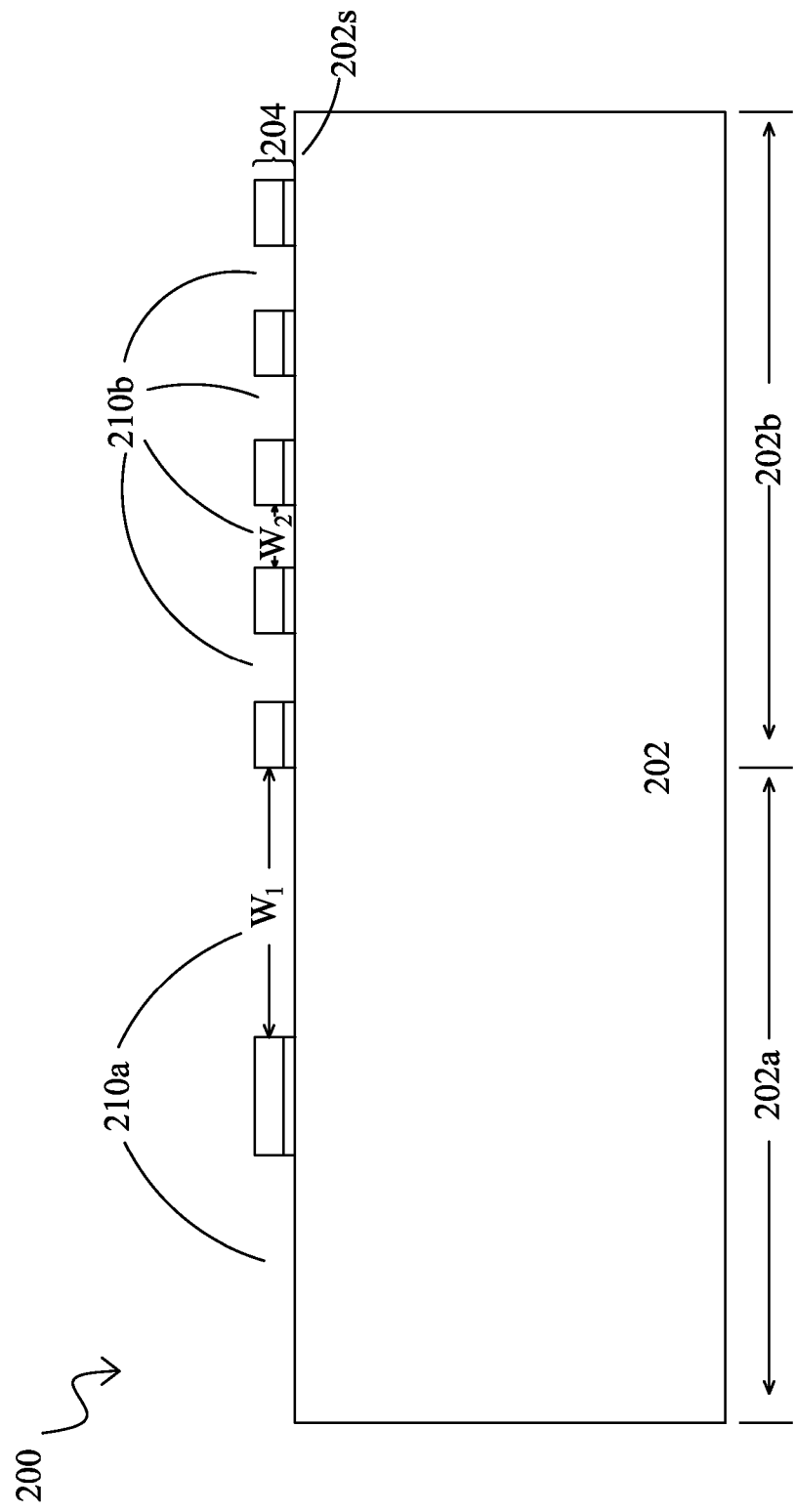

Referring to FIG. 2B, subsequent to the formation of the plurality of the first openings 208a and the plurality of the second opening 208b in the photo-sensitive layer 206, the mask layer 204b and pad layer 204a are etched through the plurality of the first openings 208a and the plurality of the second opening 208b to forming a patterned hardmask layer 204, thereby exposing underlying semiconductor substrate 202. The patterned hardmask layer 204 comprises a plurality of third openings 210a has the first width $W_1$ and a plurality of fourth opening 210b has a second width $W_2$ less than the first width $W_1$.

In at least one embodiment, the etching step may be performed using a dry etching process, for example, the dry etching process may be performed at an electrostatic chuck (ESC) temperature between about 45° C. to 65° C. and under a pressure of about 2 mTorr to 20 mTorr and a source power of about 500 to 1000 W, using a chemical selected from $NF_3$, $CF_4$, and $SF_6$ as an etching gas. The photo-sensitive layer 206 is then removed.

The process steps up to this point have provided the substrate 202 having a patterned hardmask layer 204 over a substrate 202 comprising a major surface 202s, thereby exposing underlying semiconductor substrate 202. The exposed semiconductor substrate 202 is then etched to form trenches extending downward from the substrate major surface 202s. Portions of the semiconductor substrate 202 between trenches form semiconductor fins.

Figure 2C:
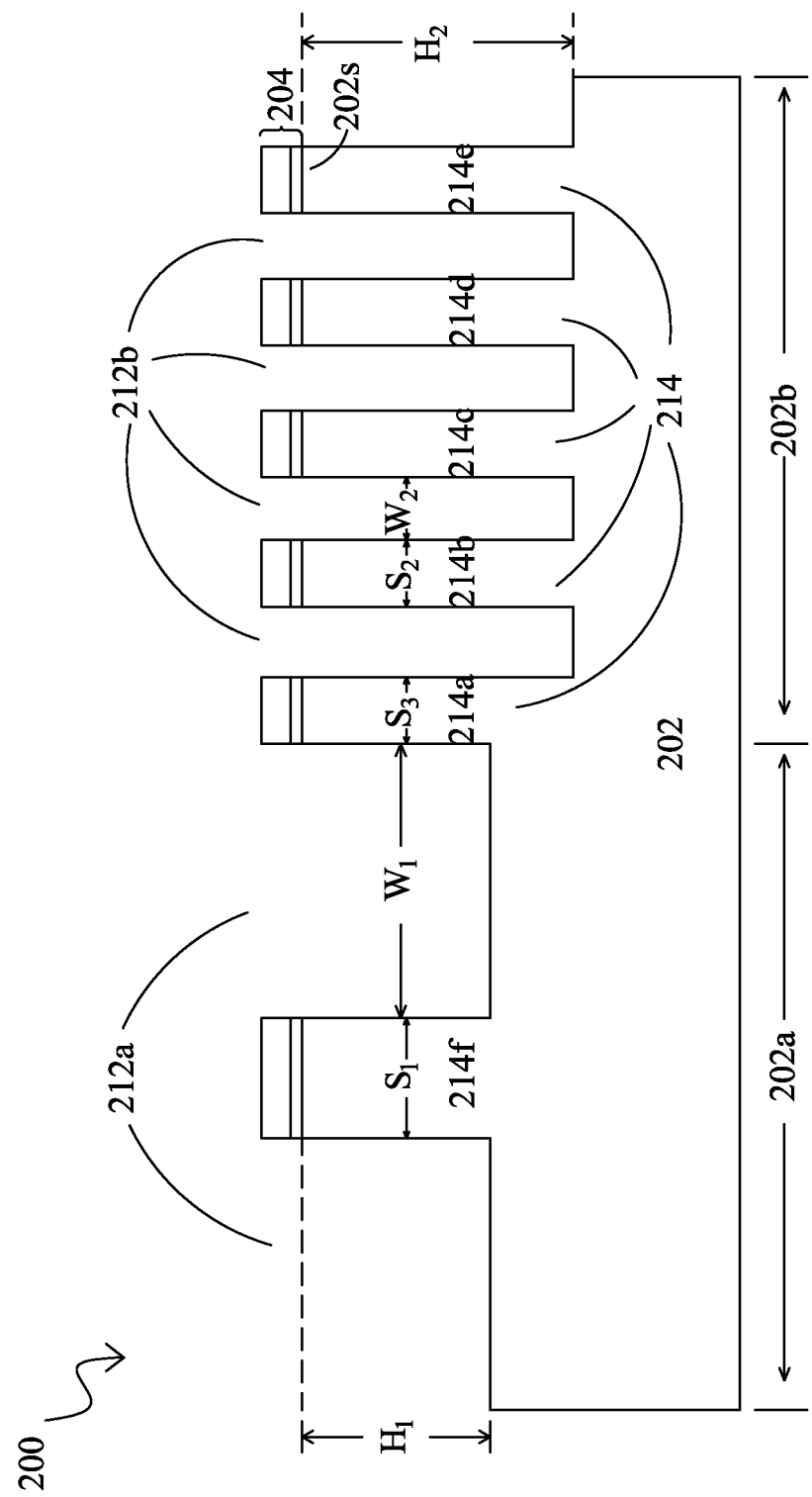
Figure 3A:
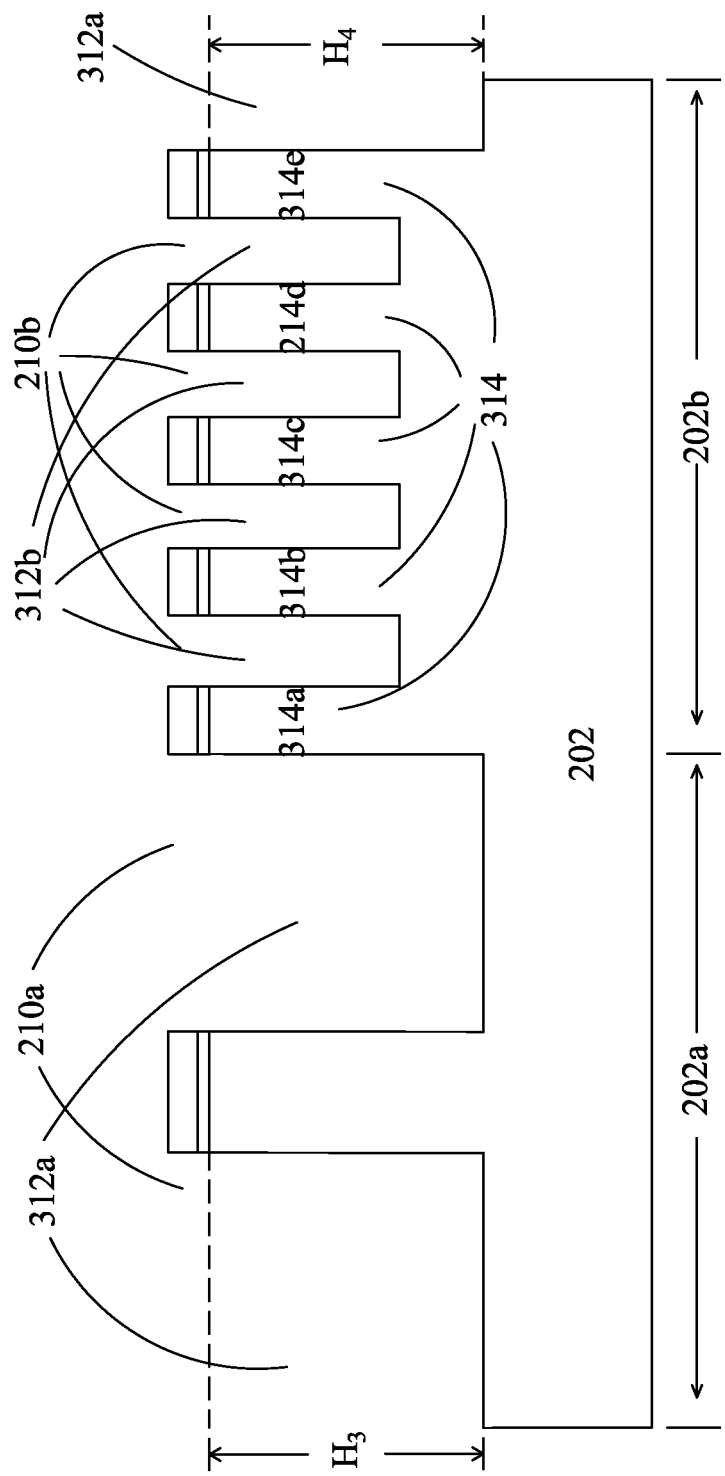
FIGS. 3A-3B are cross-sectional views of two example conventional FinFETs at stages of fabrication comparable to that of FIG. 2C and FIG. 2D, respectively.

FIG. 3A is a cross-sectional view of a conventional FinFETs at a stage of fabrication comparable to that of FIG. 2C. Conventionally, the etching step may be performed using a dry etching process. Due to more polymer formation on surface of trenches through the plurality of the fourth openings 210b during the dry etching process, a fourth height $H_4$ of a plurality of fourth trenches 312b in the dense region 202b formed through the plurality of the fourth openings 210b is less than a third height $H_3$ of a plurality of third trenches 312a in the iso region 202a formed through the plurality of the third opening 210a. In at least one configuration, portions of the semiconductor substrate 202 between the plurality of third trenches 312a and the plurality of fourth trenches 312b form a plurality of semiconductor fins, such as outer fins 314a and 314e. In another configuration, portions of the semiconductor substrate 202 between the plurality of fourth trenches 312b form a plurality of semiconductor fins, such as inner fins 314b, 314c, and 314d. In the configuration depicted in FIG. 3A, a subset of the semiconductor fins 314 of one FinFET may comprise the outer fins 314a and 314e and inner fins 314b, 314c, and 314d.

Figure 2D:
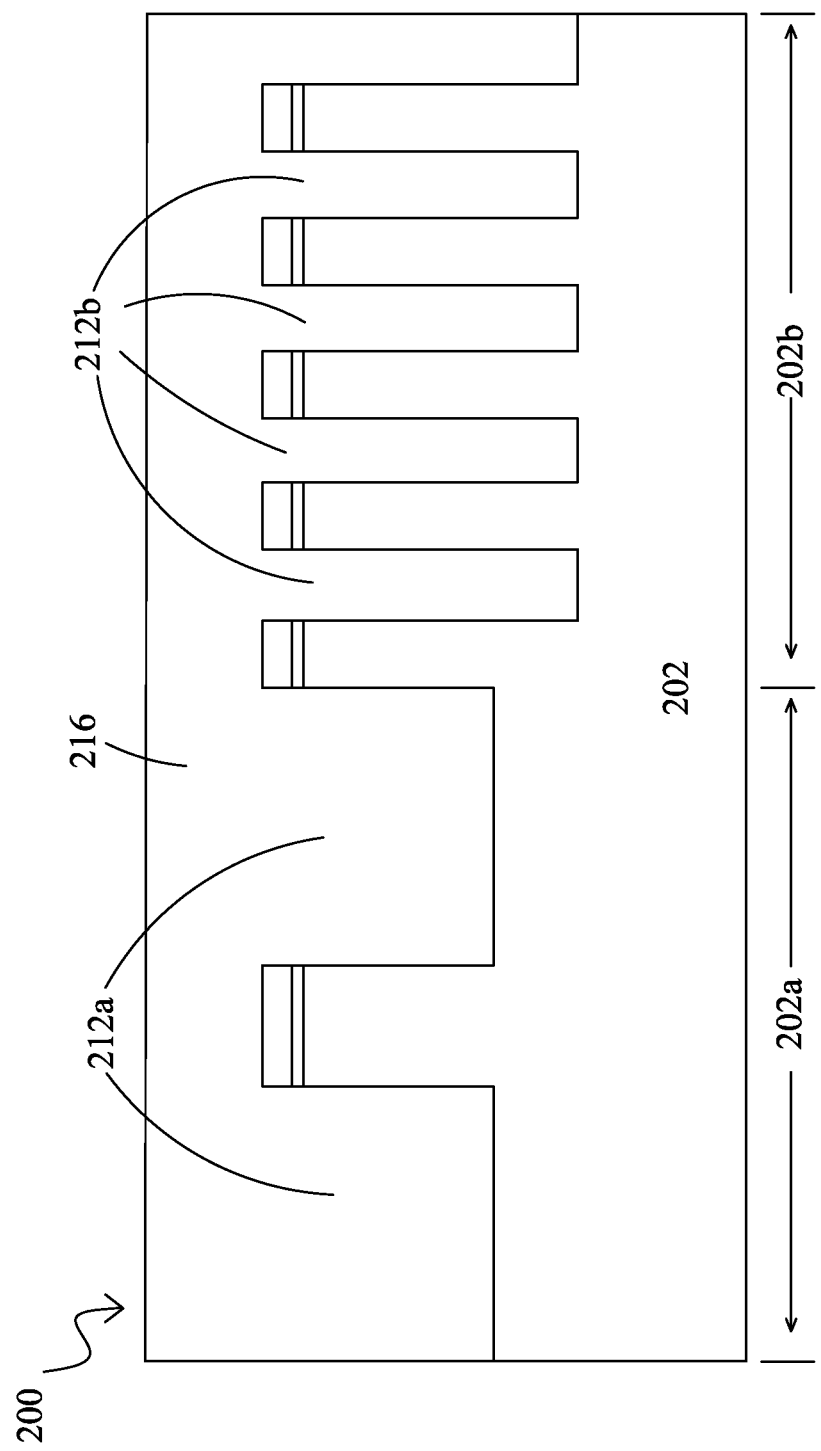
Figure 3B:
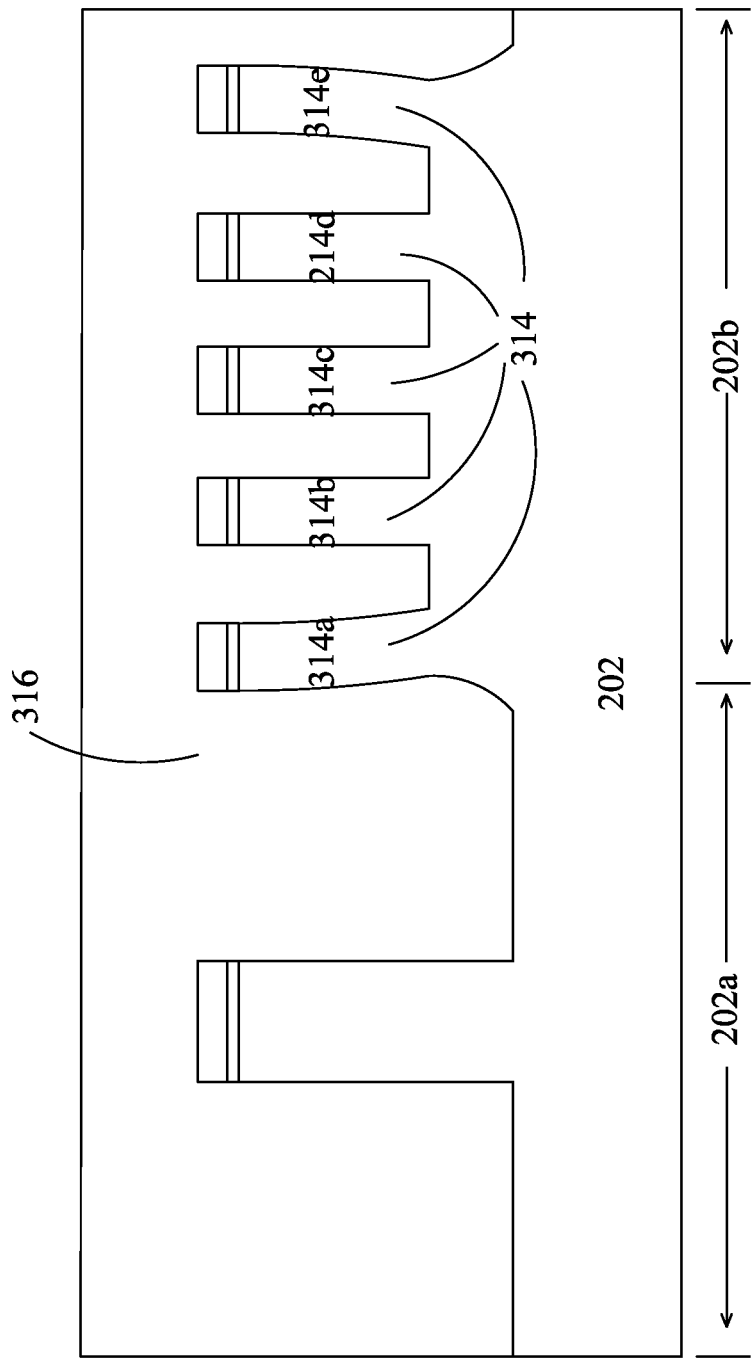

FIG. 3B is a cross-sectional view of a conventional FinFETs at a stage of fabrication comparable to that of FIG. 2D. However, after filling the plurality of third trenches 312a and the plurality of fourth trenches 312b with a shallow trench isolation (STI) oxide 316, stress on inner fins 314b, 314c, and 314d adjacent to similar trenches 312b with same height $H_3$ is low, while stress on outer fins 314a and 314e adjacent to different trenches 312a and 312b with different heights $H_3$ and $H_4$ is high. The high stress of the STI oxide 316 may deform the outer fins 314a and 314e (shown in FIG. 3B), thereby degrading the device performance.

Accordingly, the processing discussed below with reference to FIGS. 2C and 2D may etch the semiconductor substrate 202 with less polymer formation on surface of trenches through the plurality of the fourth openings 210b to increase trench height in the dense region 202b. This can help reduce stress on outer fins, thereby fabricating uniform fins of the FinFET 200 and thus improving device performance.

In the depicted embodiment, after forming the patterned hardmask layer 204 to expose underlying semiconductor substrate 202, the exposed semiconductor substrate 202 is then etched to form trenches extending downward from the substrate major surface 202s. FIG. 2C shows the FinFET 200 of FIG. 2B after forming a plurality of first trenches 212a and a plurality of second trenches 212b. The plurality of first trenches 212a has the first width $W_1$ and extends downward from the substrate major surface 202s to a first height $H_1$. The plurality of second trenches 212b has a second width $W_2$ less than first width $W_1$ and extends downward from the substrate major surface 202s to a second height $H_2$ greater than the first height $H_1$. Because the second height $H_2$ is greater than the first height $H_1$, this can help reduce stress on outer fins after STI oxide formation, thereby fabricating uniform fins of the FinFET 200 and thus improving device performance.

In at least one embodiment, the second width $W_2$ ranges from about 300 Å to about 1500 Å. In some embodiments, a ratio of the second width $W_2$ to the first width $W_1$ is from about 0.1 to about 0.5. In another embodiment, the second height $H_2$ may range from about 1200 Å to about 2500 Å. In another embodiment, a ratio of the second height $H_2$ to the first height $H_1$ is from about 1.05 to about 1.25. One skilled in the art will realize, however, that the dimensions and values recited throughout the descriptions are merely examples, and may be changed to suit different scales of integrated circuits.

In at least one embodiment, the plurality of first trenches 212a may be strips (viewed from in the top of the FinFET 200) parallel to each other and spaced with respect to each other. A first space $S_1$ between adjacent first trenches 212a defines a first fin 214f. In the depicted embodiment, the first fin 214f comprises substantially vertical sidewalls. In some alternative embodiment, the first fin 214f comprises tapered sidewalls (not shown).

In another embodiment, the plurality of second trenches 212b may be strips (viewed from in the top of the FinFET 200) parallel to each other and spaced with respect to each other. A second space $S_2$ between adjacent second trenches 212b defines a subset of second fins, such as inner fins 214b, 214c and 214d. In the depicted embodiment, each of the inner fins 214b, 214c and 214d comprises substantially vertical sidewalls. In some alternative embodiment, each of the inner fins 214b, 214c and 214d, comprises tapered sidewalls (not shown). In some embodiments, the second space $S_2$ is equal to or less than the first space $S_1$. In some embodiments, a ratio of the second space $S_2$ to the first space $S_1$ is from about 0.5 to about 1.

Further, a third space $S_3$ between adjacent first trench 212a and second trench 212b defines another subset of second fins, such as outer fins 214a and 214e. In the depicted embodiment, each of the outer fins 214a and 214e comprises substantially vertical sidewalls. In some alternative embodiment, each of the outer fins 214a and 214e comprises tapered sidewalls (not shown). In some embodiments, the third space $S_3$ is substantially equal to the second space $S_2$. In some embodiments, a ratio of the third space $S_3$ to the second space $S_2$ is from about 0.9 to about 1.1. In the depicted embodiment, a subset of the second fins 214 of the FinFET 200 may comprise the outer fins 214a and 214e and inner fins 214b, 214c, and 214d.

In at least one embodiment, the etching step may be performed using a dry etching process, for example, the dry etching process may be performed at an electrostatic chuck (ESC) temperature between about 90° C. to 120° C. and under a pressure of about 2 mTorr to 20 mTorr, and under a source power of about 500 to 1000 W and a pulse bias voltage, using a chemical selected from $NF_3$, $CF_4$, and $SF_6$ as an etching gas. Next, a cleaning may be performed to remove a native oxide of the semiconductor substrate 202. The cleaning may be performed using diluted hydrofluoric (DHF) acid.

Liner oxide (not shown) is then optionally formed in the plurality of first trenches 212a and the plurality of first trenches 212b. In an embodiment, liner oxide may be a thermal oxide having a thickness ranging from about 20 Å to about 500 Å. In some embodiments, liner oxide may be formed using in-situ steam generation (ISSG) and the like. The formation of liner oxide rounds corners of the trenches 212a and 212b, which reduces the electrical fields, and hence improves the performance of the resulting integrated circuit.

FIG. 2D depicts the resulting structure after filling the trenches 212a and 212b with a dielectric material 216. In some embodiments, the dielectric material 216 may include silicon oxide, and hence is also referred to as oxide 216 in the present disclosure. In some embodiments, other dielectric materials, such as silicon nitride, silicon oxynitride, fluoride-doped silicate glass (FSG), or a low-K dielectric material, may also be used. In an embodiment, the oxide 216 may be formed using a high-density-plasma (HDP) CVD process, using silane ($SiH_4$) and oxygen ($O_2$) as reacting precursors. In other embodiment, the oxide 216 may be formed using a sub-atmospheric CVD (SACVD) process or high aspect-ratio process (HARP), wherein process gases may comprise tetra-ethylorthosilicate (TEOS) and ozone ($O_3$). In yet some other embodiments, the oxide 216 may be formed using a spin-on-dielectric (SOD) process, such as hydrogen silsesquioxane (HSQ) or methyl silsesquioxane (MSQ). Because the second height $H_2$ is greater than the first height $H_1$, this can help reduce stress on outer fins after STI oxide 216 formation, thereby fabricating uniform fins of the FinFET 200 and thus improving device performance.

Figure 2E:
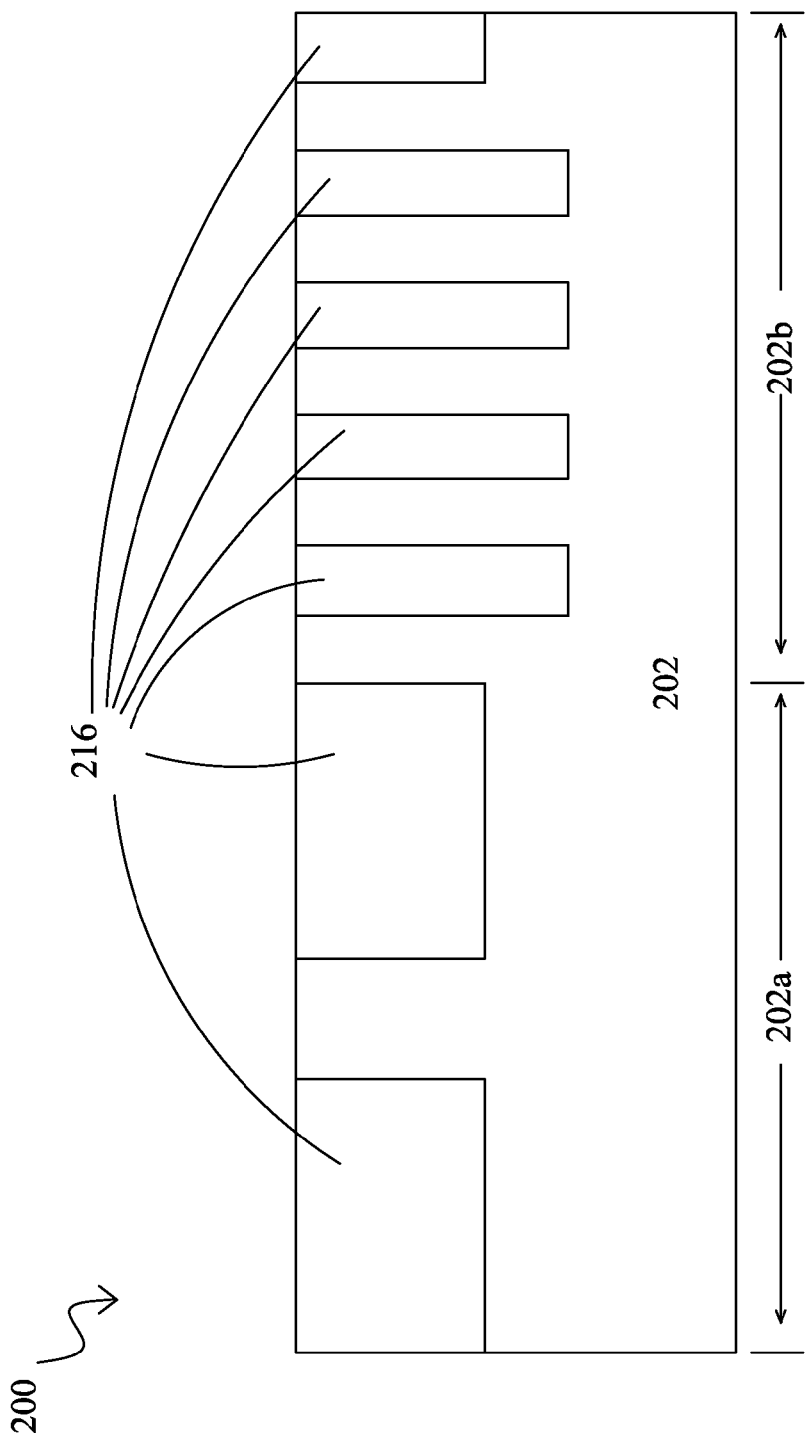

Referring to FIG. 2E, after filling the trenches 212a and 212b with a dielectric material 216, a chemical mechanical polish is then performed, followed by the removal of the mask layer 204b and pad layer 204a. The CMP process and the removal of the mask layer 204b and pad layer 204a produce the structure shown in FIG. 2E. In at least one embodiment, the mask layer 204b is formed of silicon nitride, the mask layer 204b may be removed using a wet process using hot $H_3PO_4$, while the pad layer 204a may be removed using diluted HF acid, if formed of silicon oxide. In some alternative embodiments, the removal of the mask layer 204b and pad layer 204a may be performed after the recessing of the insulation layers 216, which recessing step is shown in FIG. 2F.

Figure 2F:
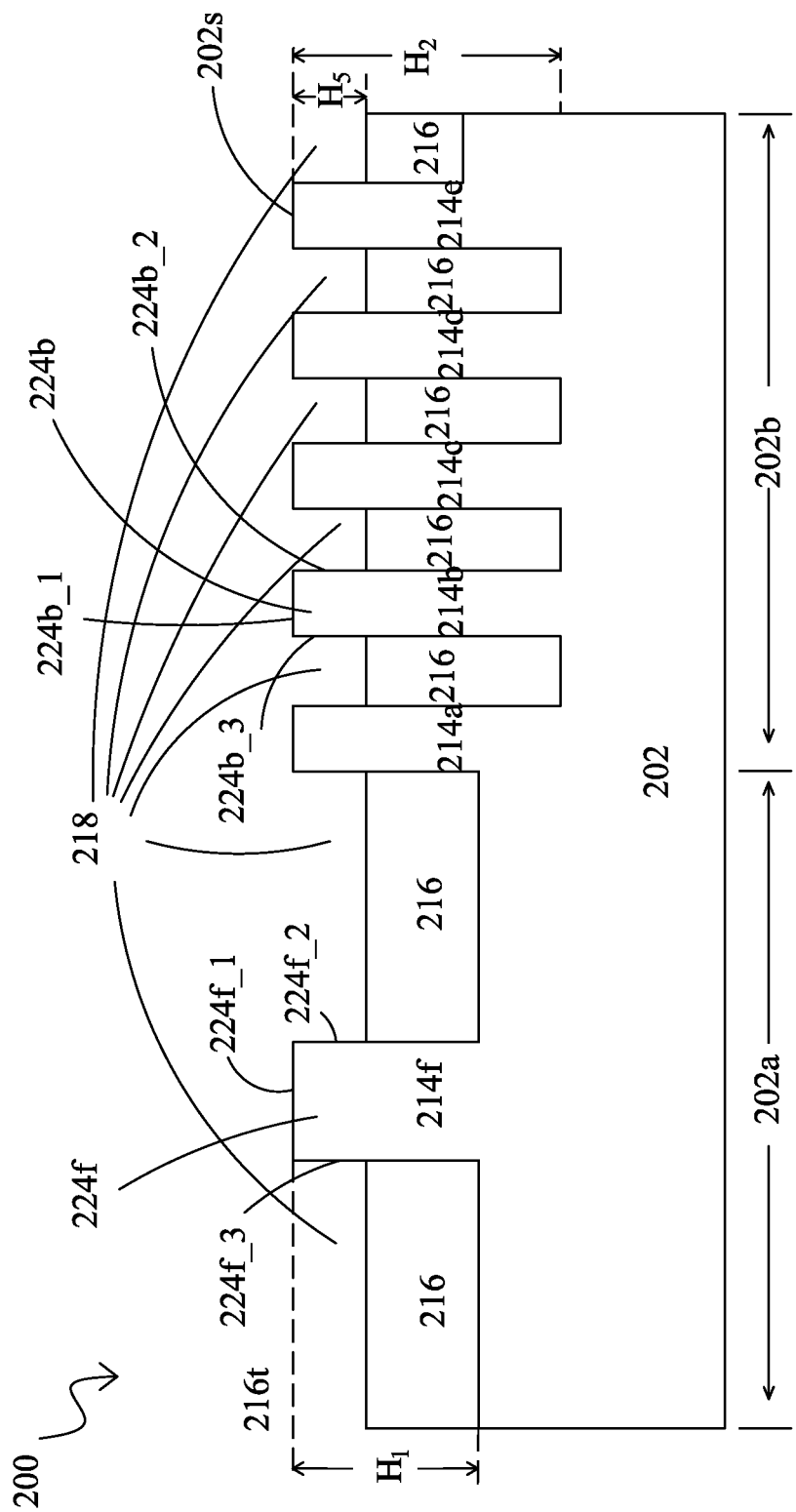

As shown in FIG. 2F, the insulation layers 216 are recessed by an etching step, resulting in recesses 218. In at least one embodiment, the etching step may be performed using a wet etching process, for example, by dipping the substrate 202 in hydrofluoric acid (HF). In another embodiment, the etching step may be performed using a dry etching process, for example, the dry etching process may be performed using $CHF_3$ or $BF_3$ as etching gases.

The remaining insulation layer 216 comprises a top surface 216t extending downward from the substrate major surface 202s to a fifth height $H_5$ less than the first height $H_1$ and second height $H_2$, whereby upper portion 224f of the first fin 214f and upper portion 224b of the second fin 214b extent beyond the top surface 216t of the insulation layer 216. In at least one embodiment, the fifth height $H_5$ may be between about 300 Å to about 1000 Å, although it may also be greater or smaller. In the depicted embodiment, the upper portion 224f of the first fin 214f may comprise a top surface 224f_1 and sidewalls 224f_13 2 and 224f_3, while the upper portion 224b of the second fin 214b comprise a top surface 224b_1 and sidewalls 224b_2 and 224b_3.

Figure 2G:
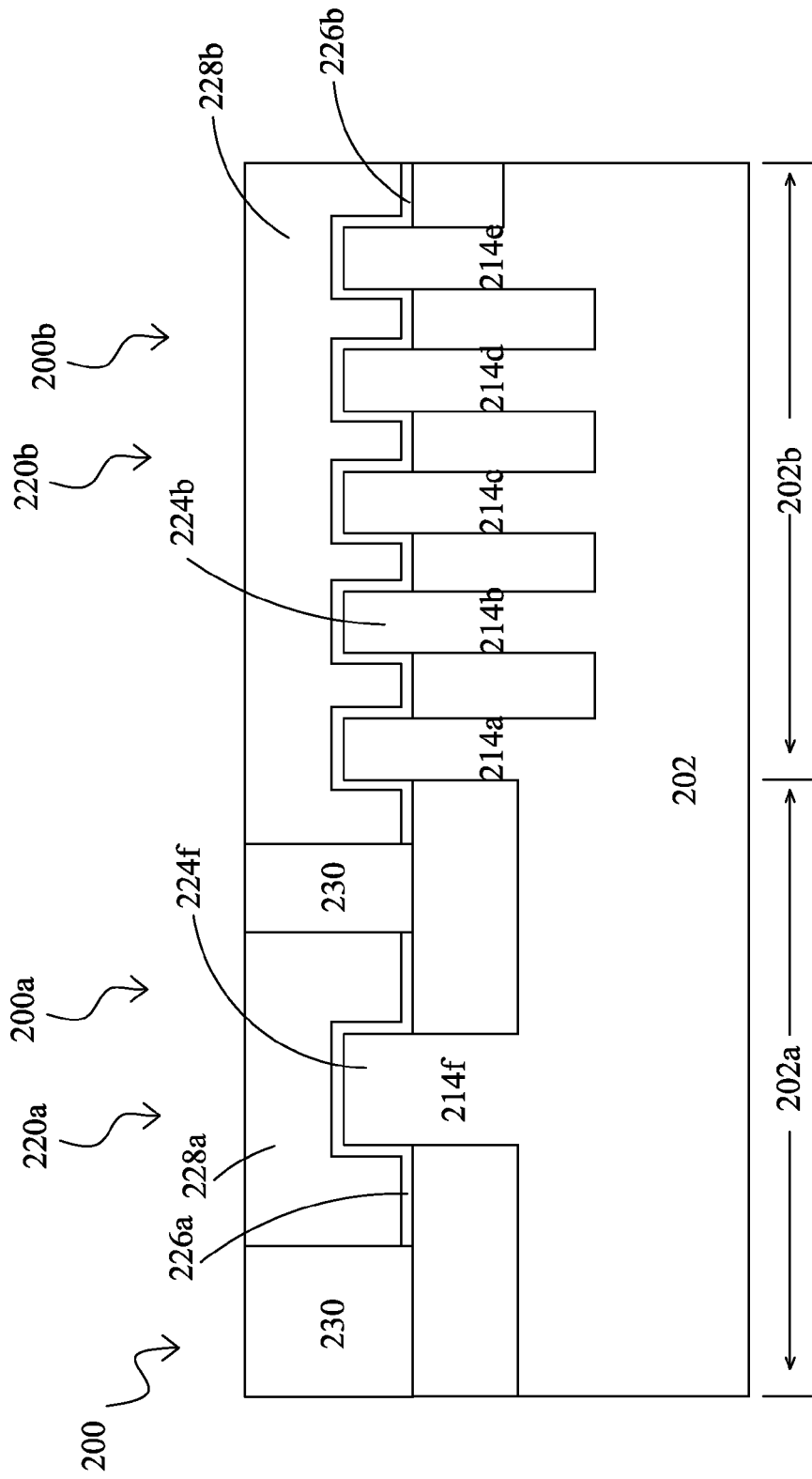

Referring to FIG. 2G, as well as FIGS. 2C and 2F, following formation the recesses 218, a first gate stack 220a is formed over the upper portion 224f of the first fin 214f, while a second gate stack 220b is formed over the upper portion 224b of the second fin 214b. The first gate stack 220a and second gate stack 220b are spaced from each other by a dielectric 230. In some embodiments, each of the first gate stack 220a and second gate stack 220b comprises a gate dielectric layer 226 and a gate electrode layer 228 over the gate dielectric layer 226. Thus, the FinFET 200 comprises a first FinFET 200a and a second FinFET 200b. In at least one embodiment, the first FinFET 200a comprises a plurality of first trenches 212a having a first width $W_1$ and extending downward from the substrate major surface 202s to a first height $H_1$, wherein a first space $S_1$ between adjacent first trenches 212a defines a first fin 214f; a first gate dielectric 226a on a top surface 224f_1 and sidewalls 224f_2 and 224f_3 of the first fin 214f; and a first gate electrode 228a on the first gate dielectric 226a. In another embodiment, the second FinFET 200b comprises a plurality of second trenches 212b having a second width $W_2$ less than first width $W_1$ and extending downward from the substrate major surface 202s to a second height $H_2$ greater than the first height $H_1$, wherein a second space $S_2$ between adjacent second trenches 212b defines a second fin 214b; a second gate dielectric 226b on a top surface 224b_1 and sidewalls 224b_2 and 224b_3 of the second fin 214b; and a second gate electrode 228b on the second gate dielectric 226b.

In the depicted embodiment, a gate dielectric 226 is formed to cover the upper portion 224f of the first fin 214f and the upper portion 224b of the second fin 214b. In some embodiments, the gate dielectric 226 may include silicon oxide, silicon nitride, silicon oxy-nitride, or high-k dielectrics. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. In the present embodiment, the gate dielectric 226 is a high-k dielectric layer with a thickness in the range of about 10 to 30 angstroms. The gate dielectric 226 may be formed using a suitable process such as atomic layer deposition (ALD), chemical vapor deposition (CVD), physical vapor deposition (PVD), thermal oxidation, UV-ozone oxidation, or combinations thereof. The gate dielectric 226 may further comprise an interfacial layer (not shown) to reduce damage between the gate dielectric 226 and the upper portion 224f of the first fin 214f (and the upper portion 224b of the second fin 214b). The interfacial layer may comprise silicon oxide.

The gate electrode 228 is then formed on the gate dielectric 226. In at least one embodiment, the upper portion 224f of the first fin 214f may be used to form a separate FinFET, such as the first FinFET 200a, which may be a portion of an I/O device. In some alternative embodiments, the gate electrode 228 may cover the upper portion 224b of more than one semiconductor fin 214b, so that the resulting FinFET comprises more than one fin, such as the second FinFET 200b, which may be a portion of a core device.

In some embodiments, the gate electrode 228 may comprise a single layer or multilayer structure. In the present embodiment, the gate electrode 228 may comprise poly-silicon. Further, the gate electrode 228 may be doped poly-silicon with the uniform or non-uniform doping. In some alternative embodiments, the gate electrode layer 228 may include a metal such as Al, Cu, W, Ti, Ta, TiN, TiAl, TiAlN, TaN, NiSi, CoSi, other conductive materials with a work function compatible with the substrate material, or combinations thereof. In the present embodiment, the gate electrode 228 comprises a thickness in the range of about 30 nm to about 60 nm. The gate electrode 228 may be formed using a suitable process such as ALD, CVD, PVD, plating, or combinations thereof.

It is understood that the FinFET 200 may undergo further CMOS processes to form various features such as source/drain regions, contacts/vias, interconnect metal layers, dielectric layers, passivation layers, etc. Thus, Applicant's method can help reduce stress on outer fins, thereby fabricating uniform fins of the FinFET 200 and thus improving device performance.

In accordance with embodiments, a fin field effect transistor (FinFET) comprises a substrate comprising a major surface; a plurality of first trenches having a first width and extending downward from the substrate major surface to a first height, wherein a first space between adjacent first trenches defines a first fin; and a plurality of second trenches having a second width less than first width and extending downward from the substrate major surface to a second height greater than the first height, wherein a second space between adjacent second trenches defines a second fin.

In accordance with another embodiments, a semiconductor device comprises a substrate comprising a major surface; a first Fin field effect transistor (FinFET) comprising a plurality of first trenches having a first width and extending downward from the substrate major surface to a first height, wherein a first space between adjacent first trenches defines a first fin; a first gate dielectric on a top surface and sidewalls of the first fin; and a first gate electrode on the first gate dielectric; and a second FinFET comprising a plurality of second trenches having a second width less than first width and extending downward from the substrate major surface to a second height greater than the first height, wherein a second space between adjacent second trenches defines a second fin; a second gate dielectric on a top surface and sidewalls of the second fin; and a second gate electrode on the second gate dielectric.

In accordance with another embodiments, a method of fabricating a semiconductor device comprises forming a patterned hardmask layer over a substrate comprising a major surface; and forming a plurality of first trenches and a plurality of second trenches performed at an electrostatic chuck (ESC) temperature between about 90° C. to 120° C., the plurality of first trenches having a first width and extending downward from the substrate major surface to a first height, the plurality of second trenches having a second width less than first width and extending downward from the substrate major surface to a second height greater than the first height.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A fin field effect transistor (FinFET) comprising:
a substrate comprising a major surface;
a plurality of first trenches having a first width and a first depth, each first trench of the plurality of first trenches extending downward from the substrate major surface to a first height, wherein a first space between adjacent first trenches defines a first fin;
a plurality of second trenches having a second width and a second depth, the second width less than first width, each second trench of the plurality of second trenches extending downward from the substrate major surface to a second height greater than the first height, wherein a second space between adjacent second trenches defines a second fin;
a first isolation structure partially filling each first trench of the plurality of first trenches;
a second isolation structure partially filling each second trench of the plurality of second trenches, wherein a difference between a height of the first isolation structure and the first depth is substantially equal to a difference between a height of the second isolation structure and the second depth;
wherein the first fin has a third width; and
the second fin has a fourth width that is different from the third width.

2. The FinFET of claim 1, wherein a ratio of the second width to the first width is from about 0.1 to about 0.5.

3. The FinFET of claim 1, wherein a ratio of the second height to the first height is from about 1.05 to about 1.25.

4. The FinFET of claim 1, wherein the second space is equal to or less than the first space.

5. The FinFET of claim 1, wherein a ratio of the second space to the first space is from about 0.5 to about 1.

6. The FinFET of claim 1, the first fin comprises substantially vertical sidewalls.

7. The FinFET of claim 1, wherein the second fin comprises tapered sidewalls.

8. A semiconductor device comprising:
a substrate comprising a major surface;
a first Fin field effect transistor (FinFET) comprising:
a plurality of first trenches having a first width and a first depth, each first trench of the plurality of first trenches extending downward from the substrate major surface to a first height, wherein a first space between adjacent first trenches defines a first fin;
a first gate dielectric on a top surface and sidewalls of the first fin; and
a first gate electrode on the first gate dielectric;
a second FinFET comprising:
a plurality of second trenches having a second width and a second depth, the second width less than first width, each second trench of the plurality of second trenches extending downward from the substrate major surface to a second height greater than the first height, wherein a second space between adjacent second trenches defines a second fin;

a second gate dielectric on a top surface and sidewalls of the second fin;

a second gate electrode on the second gate dielectric;

wherein the first fin has a third width;

the second fin has a fourth width that is different from the third width: and a first isolation structure partially filling each first trench of the plurality of first trenches; and a second isolation structure partially filling each second trench of the plurality of second trenches, wherein a difference between a height of the first isolation structure and the first depth is substantially equal to a difference between a height of the second isolation structure and the second depth.

9. The semiconductor device of claim 8, wherein a ratio of the second width to the first width is from about 0.1 to about 0.5.

10. The semiconductor device of claim 8, wherein a ratio of the second height to the first height is from about 1.05 to about 1.25.

11. The semiconductor device of claim 8, wherein the second space is equal to or less than the first space.

12. The semiconductor device of claim 8, wherein a ratio of the second space to the first space is from about 0.5 to about 1.

13. The semiconductor device of claim 8, the first fin comprises substantially vertical sidewalls.

14. The semiconductor device of claim 8, wherein the second fin comprises tapered sidewalls.

15. The semiconductor device of claim 8, wherein the first fin is a portion of an I/O device and the second fin is a portion of a core device.

16. A semiconductor device comprising:

a substrate comprising a first region and a second region;

a plurality of first trenches in the first region of the substrate, each of the plurality of first trenches having a first depth;

at least one first fin between adjacent first trenches of the plurality of first trenches;

a plurality of second trenches in the second region of the substrate, each of the plurality of second trenches having a second depth less than the first depth;

at least one second fin between adjacent second trenches of the plurality of second trenches;

at least one third fin between one second trench of the plurality of second trenches and one first trench of the plurality of first trenches, wherein a height of a first sidewall of the at least one third fin is equal to the first depth, and a height of a second sidewall of the at least one third fin opposite the first sidewall is equal to the second depth;

wherein the first fin has a third width; and the second fin has a fourth width that is different from the third width;

a first isolation structure partially filling each first trench of the plurality of first trenches; and a second isolation structure partially filling each second trench of the plurality of second trenches, wherein a difference between a height of the first isolation structure and the first depth is substantially equal to a difference between a height of the second isolation structure and the second depth.

17. The semiconductor device of claim 16, wherein a ratio of a width of the at least one third fin to a width of the at least one first fin ranges from 0.9 to 1.1.

18. The semiconductor device of claim 16, further comprising:

a first gate structure over the at least one first fin and the at least one third fin;

a second gate structure over the at least one second fin; and an isolation structure separating the first gate structure from the second gate structure.

19. The semiconductor device of claim 16, wherein the difference between a height of the first isolation feature and the first depth ranges from about 300 Angstroms (Å) to about 1000 Å.

20. The semiconductor device of claim 16, wherein the substrate is doped.

* * * * *